US008532592B1

United States Patent
Yu et al.

(10) Patent No.: US 8,532,592 B1
(45) Date of Patent: *Sep. 10, 2013

(54) INTEGRATED SIGNAL ANALYZER FOR ADAPTIVE CONTROL OF MIXED-SIGNAL INTEGRATED CIRCUITS

(75) Inventors: Qian Yu, Sunnyvale, CA (US); Abhijit G. Shanbhag, Sunnyvale, CA (US); Yan Wang, Sunnyvale, CA (US)

(73) Assignee: Scintera Networks, Inc., Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/407,511

(22) Filed: Feb. 28, 2012

Related U.S. Application Data

(63) Continuation of application No. 12/340,032, filed on Dec. 19, 2008, now Pat. No. 8,145,150.

(51) Int. Cl.
*H04B 1/04* (2006.01)

(52) U.S. Cl.
USPC .......... 455/114.3; 455/558; 455/115.2; 455/574; 455/132; 455/296; 455/130; 455/73; 455/106; 455/125; 455/120; 375/216; 375/298; 375/261; 375/326; 375/316

(58) Field of Classification Search
USPC .......... 455/558, 39, 115.2, 574, 572, 132, 455/205, 296, 130, 73, 106, 125, 120; 375/216, 375/298, 261, 326, 316, 347
See application file for complete search history.

(56) References Cited

U.S. PATENT DOCUMENTS

| | | | | |
|---|---|---|---|---|
| 5,475,707 A | * | 12/1995 | Ficarra et al. | 375/141 |
| 5,524,281 A | * | 6/1996 | Bradley et al. | 455/67.15 |
| 6,188,253 B1 | * | 2/2001 | Gage et al. | 327/105 |
| 6,531,957 B1 | * | 3/2003 | Nysen | 340/10.1 |
| 6,603,806 B2 | * | 8/2003 | Martone | 375/219 |
| 6,940,916 B1 | * | 9/2005 | Warner et al. | 375/261 |
| 6,950,009 B1 | * | 9/2005 | Nysen | 340/10.41 |
| 7,233,629 B2 | * | 6/2007 | Auranen | 375/316 |
| 7,427,217 B2 | * | 9/2008 | Chou et al. | 439/660 |
| 7,590,432 B2 | * | 9/2009 | Behzad et al. | 455/574 |
| 7,876,869 B1 | * | 1/2011 | Gupta | 375/350 |

* cited by examiner

*Primary Examiner* — Lam T Mai

(74) *Attorney, Agent, or Firm* — Edward C. Kwok; Hogan Lovells US LLP

(57) ABSTRACT

A mixed-signal adaptive integrated circuit may comprise a primary function circuit, a digitally controlled analog sub-system cooperatively connected with the primary function circuit, and an on-chip signal analyzer. The on-chip signal analyzer may be arranged to analyze RF signals. The signal analyzer may comprise at least one multiplexor for selecting selected RF signals for comparison and analysis, and may comprise a digital signal processor (DSP) for analyzing the selected RF signals and adjusting at least one operational parameter of the digitally controlled analog sub-system responsive to the analysis.

14 Claims, 2 Drawing Sheets

United States Patent US 8,532,592 B1

INTEGRATED SIGNAL ANALYZER FOR ADAPTIVE CONTROL OF MIXED-SIGNAL INTEGRATED CIRCUITS

CROSS REFERENCE TO RELATED APPLICATIONS

The present patent application is a continuation patent application of U.S. patent application Ser. No. 12/340,032 and was filed Dec. 19, 2008 which is related to co-pending U.S. patent applications (the "Co-pending Applications"): (a) Ser. No. 12/037,455 and now U.S. Pat. No. 8,010,075, entitled "High Order Harmonics Generator," which names as inventor Frederic Roger, and was filed on Feb. 26, 2008; (b) Ser. No. 12/257,292, entitled "Error Signal Formation for Linearization," which names as inventor Adric Q. Broadwell and others, and was filed on Oct. 23, 2008 and (c) Ser. No. 12/340,111 and now U.S. Pat. No. 7,902,901 entitled "RF Squarer," which names as inventor Frederic Roger, and was filed on the same day as the present invention. The Co-pending Applications are hereby incorporated by reference in their entireties.

TECHNICAL FIELD

The present invention relates generally to mixed signal integrated circuits and more particularly to forming an integrated signal analyzer for self-healing mixed signal integrated circuits.

BACKGROUND

Mixed-signal integrated circuits, for example today's advanced mixed signal integrated circuits, may have a number of analog subsystems. The analog subsystems may be used, for example, for low-power, multi-Gigahertz signal processing. For example, a power amplifier for use in a communication system may have an analog pre-distortion circuit for reducing distortion or non-linearities caused, for example, by memory effects, power amplifier self-heating and the decoupling of a power amplifier from a power supply. Such analog subsystems may pose several design challenges. For example, three such design challenges for analog subsystems of mixed signal integrated circuits may include random transistor mismatches, process-, voltage-, and temperature-dependent performance variations, and low voltage headroom.

Digitally controlled analog cells have been developed to address such issues. For example, an analog pre-distortion circuit for a power amplifier used in communications systems is discussed in commonly assigned, pending patent application Ser. No. 12/257,292, which is incorporated by reference herein in its entirety. However, since such analog cells are subject to further inaccuracies or non-idealities due to various factors that affect performance, such as the design issues discussed above, their performance may be less-than-desirable or less than ideal. In addition, although such analog cells may be tunable, adjustable, or able to be calibrated and/or adjusted, such procedures may occur only sporadically, may disrupt operation, and may not occur automatically.

Accordingly, there is a need for an improved device or method for more-efficient monitoring and adjustment, self-monitoring and self-adjustment, or automatic adjustment or self-healing for mixed signal integrated circuits.

SUMMARY

In an example embodiment, a mixed-signal adaptive integrated circuit may comprise a primary function circuit, a digitally controlled analog sub-system cooperatively connected with the primary function circuit, and an on-chip signal analyzer. The on-chip signal analyzer may be arranged to analyze RF signals. The signal analyzer may comprise at least one multiplexor for selecting selected. RF signals for comparison and analysis, and may comprise a digital signal processor (DSP) for analyzing the selected RF signals and adjusting at least one operational parameter of the digitally controlled analog sub-system responsive to the analysis.

A self-healing analog sub-systems or circuits may provide for more-frequent and less-disruptive tuning, adjustments, or calibration. Self-healing sub-systems or circuits may provide for adjustments and corrections during operation without outside intervention. Self-healing sub-systems or circuits may operate more efficiently with better performance characteristics by adjusting, correcting or compensating for non-ideal performance characteristics of the sub-system or circuit.

DESCRIPTION OF THE DRAWINGS

It should be appreciated that like reference numerals are used to identify like elements illustrated in one or more of the figures.

DETAILED DESCRIPTION

The following discussion is directed to systems and method for forming an integrated signal analyzer for self-healing mixed signal integrated circuits. However, it will be appreciated that the integrated signal analyzer techniques disclosed herein may have broader application to the self-monitoring and/or self-healing of any integrated circuits that are subject to performance distortions and are amenable to self-monitoring and self-healing as described herein.

An integrated signal analyzer, for example a single-chip integrated signal analyzer, may provide on-chip, real-time monitoring of signal properties such as, for example, dc offsets, power, bandwidth, and power spectrum and may provide automatic configuration, adjustment, calibration or self-healing of digitally controlled cells. Such integrated signal analyzers may also provide for the extraction of information such as, for example, gain, group delay, and waveform distortion that involve measuring pairs of signals.

Figure 1:
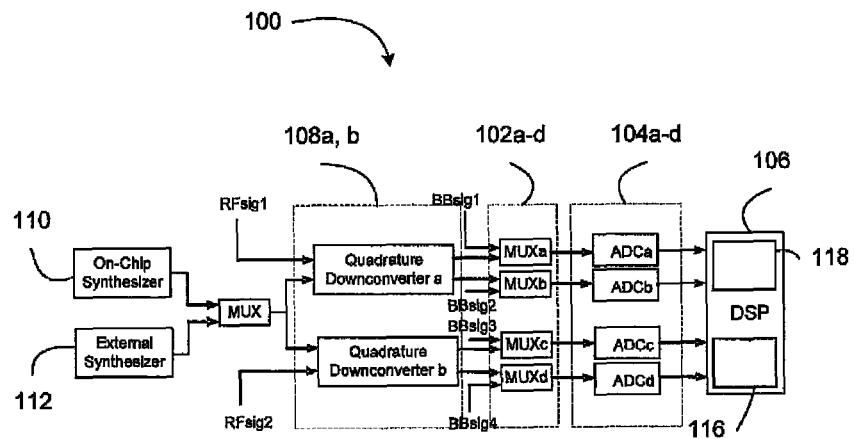
FIG. 1 is a block diagram of an example embodiment of a signal analyzer.

FIG. 1 illustrates a block diagram of an example embodiment of a signal analyzer 100. The signal analyzer 100 may be capable of being combined with or connected to digitally controlled analog devices, for example digitally controlled analog cells or subsystems of primary function circuits. The signal analyzer may be used to compensate for unique performance characteristics and variances of a particular analog device caused, for example, by random transistor mismatches, process-, voltage-, and temperature-dependent performance variations, low voltage headroom or other factors. The digitally controlled analog devices may be part of a mixed signal integrated circuit or may be an analog cell or subsystem of such an integrated circuit. The signal analyzer and analog subsystem may be used, for example, in low-power, multi-Gigahertz signal processing or other applications. In an example embodiment, the signal analyzer 100 may be connected to a pre-distortion circuit of a power amplifier suitable for use in a communication system.

In an example embodiment, a signal analyzer 100 may be a radio frequency (RF) signal analyzer. The signal analyzer 100 may include one or more multiplexors (MUX) 101, 102a-d. The MUX may be, for example, digital switches to select one of multiple inputs for output.

The multiplexors may include, for example multiplexor 101 for selecting between one of an on-chip or external synthesized signal as an input to a quadrature downconverter 108. The multiplexors 102a-102d may select from among baseband signals (bb sig) and corresponding quadrature downconverter signals.

The signal analyzer 100 may include one or more analog to digital converters (ADC) 104a-104d. The signal analyzer may also include a digital signal processor (DSP) 106 for digital signal processing. In an example embodiment, the DSP may receive four data streams, for example, 12-bit/sample, 100 MegaSamples/s, and may perform various functions, such as timing alignment, I/Q imbalance cancellation, complex gain matching, complex error signal generation, and real-time power spectrum estimate.

In an example embodiment, the digital signal processor (DSP) 106 may be a digital-circuit subsystem integrated with the digitally-controlled analog subsystem on a mixed-signal system-on-chip. The DSP 106 may be, for example, a microprocessor, programmable logic device, micro-controller or a dedicated ASIC. To facilitate high-speed real-time signal processing and to shorten the development cycle of the system-on-silicon, an example embodiment of a DSP 106 may include a dedicated DSP ASIC and a separate microcontroller 214 (FIG. 2), for example an 8051 microcontroller. The adjustment, calibration, or changes to the operating parameters may require only integer (fixed-point number) and logic calculations, and the micro-controller 214 may make the calculations/determinations from control software (or firmware) on the micro-controller 214. Computational intensive tasks, for example, evaluation of a floating-point math function, would better be implemented in the DSP ASIC block. In principle, the separate micro-controller and the dedicated DSP ASIC may be merged, if using a general-purpose digital signal processor (for narrow-band signals) or a single ASIC, although such embodiments may require longer development cycles or incur other costs of development or manufacture. The DSP 106 may refer to both a DSP ASIC and a microcontroller 214, or any other combination of control hardware, software or firmware that works together to perform the functions of the DSP 106.

In an example embodiment, a separate microcontroller 214 (FIG. 2) may provide control signals to the DSP 106 to reprogram or write information to memory 118 of the DSP 106, for example may write configuration registers of the DSP. In an example embodiment, the microcontroller 214 may also read output results from the DSP 106. Writing configuration registers may provide the changes or adaptations for the self-healing or calibration to be provided by the signal analyzer 100. In an example embodiment, the DSP 106 may be specially designed for time-and-frequency resolved "error signal" analysis, and may feature a real-time signal processing architecture using minimum amount of memory. In an example embodiment, "error signal" may refer to the difference between a pair of signals.

In an example embodiment, the signal analyzer may have one or more quadrature down-converters 108a, 108b, for example two quadrature down-converters. The quadrature down-converters may be used, for example, to convert an RF input signal to a pair of baseband signals, which may be referred to as in-phase and quadrature components. In an example embodiment, a local oscillator for the quadrature downconverters may be a PLL-based, on-chip frequency synthesizer 110 or an external synthesizer 112. The on-chip synthesizer may be used where an on-chip Local Oscillator is available. The external synthesizer 112, on the other hand, may be used for one-time initial calibration during Automatic Test Equipment (ATE) setup and/or testing, or be used in the case where an external Local Oscillator (LO) is available.

In an example embodiment, an external synthesizer 112 may have a higher signal quality than the on-chip synthesizer. Therefore, an external synthesizer 112 may be used for a one-time calibration. An external synthesizer may be the external local oscillator (external LO) under certain operating conditions, for example normal operating conditions. However, in other cases, an external LO may not be available. The on-chip synthesizer 110 may then be used for the down conversion. Using a power spectrum estimator (PSE) 116 of the DSP 106, a signal analyzer 100 may automatically adjust the on-chip synthesizer so that the LO frequency may be aligned with the RF input signals.

Figure 2:
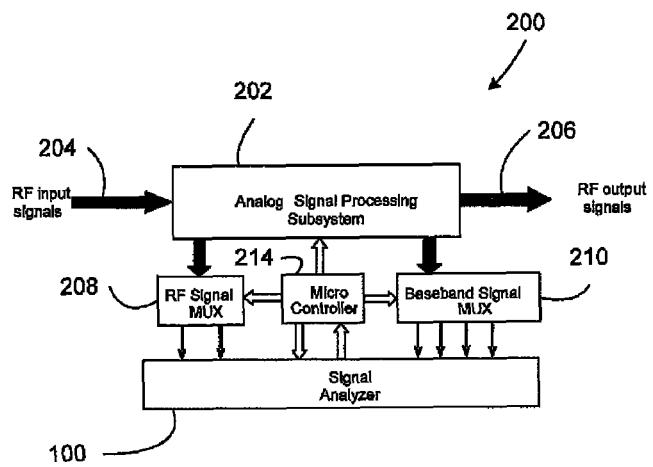
FIG. 2 is a block diagram of an example embodiment of a mixed signal processing system-on-chip.

In an example embodiment, the signal analyzer 100 may provide various measuring and analysis functions. For example, the signal analyzer 100 may measure the peak-to-average ratio, a cumulative complementary distribution function (CCDF), the power spectrum, and the out-of-band spectral leakage of an RF signal. The signal analyzer 100 may also analyze the difference between a pair of RF signals, for example the input/output signals of a RF analog subsystem. The signal analyzer 100 may further extract the power gain, the group delay, and properties of the error signal, such as mean-square error, in-band distortion, error spectrum, among other values. For example, a signal analyzer 100 may determine or extract the DC average (offset) of a signal or may be configured as a volt-meter. Functions of the signal analyzer may be controlled by digital information encoded as instructions, for example an embodied software program or firmware of the micro-controller 214 (FIG. 2).

In an example embodiment, the signal analyzer 100 may measure a dc offset, power spectrum, and a histogram of a baseband signal (bbsig) (bandwidth<half of the ADC sampling rate). The signal analyzer 100 may also analyze the difference between a pair of baseband signals, for example the input/output signals of a baseband analog subsystem. The signal analyzer may further extract the gain, group delay, and/or mean-square-error.

In example embodiments, an analog subsystem with at least one baseband signal may be an analog power waveform detector (RF input, output is the power waveform in baseband), an analog envelope waveform detector (RF input, output is the envelope in baseband), or an analog buffer amplifiers and active low-pass filters (baseband input and output). For example, the signal analyzer 100 may be arranged to find the linearity of an active low-pass filter based on operating amplifiers.

In an example embodiment, the signal analyzer may be used for self-healing through self-calibration, configuration, and/or real-time adaptation of digitally-controlled analog subsystems in mixed-signal integrated circuits with RF inputs and/or outputs. In an example embodiment, self-healing, adjustments, calibration or other changes, as desired and appropriate, may be made by reprogramming digital controls for the corresponding analog cell. The specific manner in which changes or adjustments may be made may depend on the particular design of a given application on a case-by-case basis. For example, the signal analyzer 100 may provide a performance metric, and the micro-controller may perturb the control parameters of the analog subsystem so as to optimize the performance metric using a stochastic approximation algorithm in the firmware. In an example embodiment, persons of skill in the art designing a specific application to perform a desired function may know and appreciate how the changes should be made in a specific circumstance, application or embodiment.

In an example embodiment, the RF signal MUX 208 may be designed to minimize leakage and crosstalk. An RF signal MUX 208 may be designed to minimize leakage and crosstalk, for example, by using cascaded switches. If a single-stage switch has a leakage ratio of 30 dB, a two-stage switch has a leakage ratio of 60 dB. Other methods or embodiments may be appreciated by persons of skill in the art.

In some example embodiments for particular applications, analyzing a pair of RF signals may be all that is desired. In such embodiments, the RF signal MUX 208 may not be needed. In an example embodiment, the on-chip microcontroller (214, FIG. 2) may select the RF or baseband signals from the analog signal processing subsystems, measure the signal properties in real time from the signal analyzer, and adjust the configuration of digitally controlled analog subsystems as appropriate or desired for a particular application.

FIG. 2 illustrates a block diagram of an example embodiment of a mixed signal processing system-on-chip 200. Mixed signal processing system-on-chip 200 may include, for example, an analog signal processing subsystem 202. The analog signal processing subsystem may be, for example, a pre-distortion circuit for a power amplifier suitable for use in a communication system. The subsystem 202 may have a number of RF input signals 204 and a number of RF output signals 206.

On-chip micro-controller 214 may select a number of input signals 204 and output signals 206 to be analyzed. A baseband signal multiplexor or multiplexors (MUX) 210 may select a number of baseband analog signals 216 from a group of analog baseband signals 218, for example, four out of a group of baseband analog signals as illustrated in FIG. 2. In an example embodiment, the RF signal multiplexor or multiplexors (MUX) 208 may select a number of RF analog signals 220 from a group of RF analog signals 222, for example, two RF signals 222 as illustrated in FIG. 2. In an example embodiment, Digital Signal Processor 106 (FIG. 1) may make various measurements, extract various information, and/or adjust operating parameters responsive to comparisons among the various selected RF and/or baseband signals. The adjustment, calibration or changes to the operating parameters responsive to the signals provided to the DSP may provide for self-healing, self-calibration, or real-time adjustment to correct for non-idealities in the operation of the analog circuit caused by various non-ideal conditions.

Figure 3:
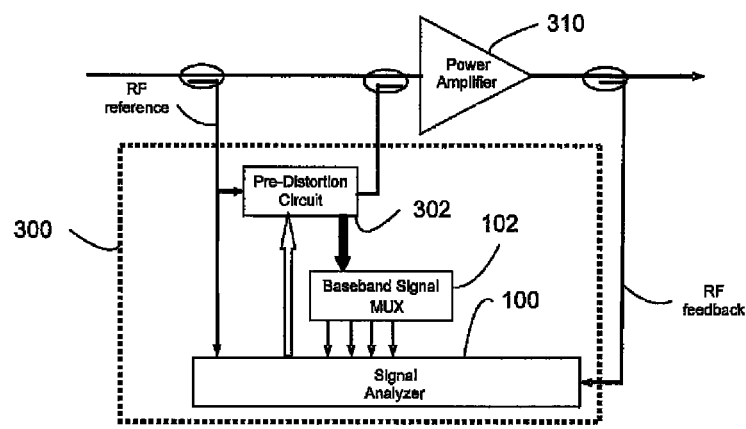
FIG. 3 is a block diagram of an example embodiment of a mixed-signal integrated circuit using an integrated signal analyzer.

FIG. 3 illustrates an example embodiment of a self-healing or adaptive integrated circuit 300 with on-chip signal analyzer 100. The circuit 300 may be an analog sub-system for use with a mixed-signal integrated circuit 310. The integrated circuit 300 may be a CMOS mixed-signal integrated circuit. The CMOS mixed-signal integrated circuit 300 may be, for example, an adaptive pre-distortion circuit suitable for use with a power amplifier 310 for use in a communication system. Although FIG. 3 illustrates a particular embodiment where circuit 300 is a pre-distortion circuit 300 and circuit 310 is a power amplifier, it is understood that the subject matter of this disclosure may be applied more generally to other analog sub-systems of other types of circuits and/or mixed-signal circuits or primary function circuits used for various applications.

In an example embodiment, the adaptive pre-distortion circuit 300 may include, a pre-distortion circuit 302, a baseband signal multiplexor or multiplexors (MUX) 302 and signal analyzer 100. The signal analyzer 100 may receive a pair of RF signals, for example an original, undistorted signal (RF reference), and an output signal (RF feedback), for example from power amplifier 310.

In an example embodiment, the signal analyzer 100 may extract an error signal. The error signal may be, for example, the difference between the RF feedback and the RF reference. The signal analyzer 100 may then perform real-time spectral analysis of the error signal. From the power spectrum of the error signal, the signal analyzer may provide a cost-function, e.g. out-of-band emission power, for adaptive adjustment of the pre-distortion circuit. From the in-band error spectrum, the signal analyzer may determine whether the power amplifier has non-idealities, for example memory effect, and the magnitude or strength of the non-ideality or memory effect.

In an example embodiment in which the analog cell or sub-system is a pre-distortion circuit 302 for use with power amplifier 310, the pre-distortion circuit 310 may have a group of circuit blocks that generate the analog waveform of a polynomial $$\sum_{k=1}^{N} c_k r^k (t - \tau_m)$$

where $r(t-\tau_m)$ is a delayed copy of the envelope of the RF reference signal. Depending on the strength of the memory effect of power amplifier (PA) 310, the pre-distortion circuit may be auto-configured to use a variable number of polynomial blocks. The signal analyzer can also monitor various baseband signals inside the polynomial blocks for self-calibration.

Figure 4:
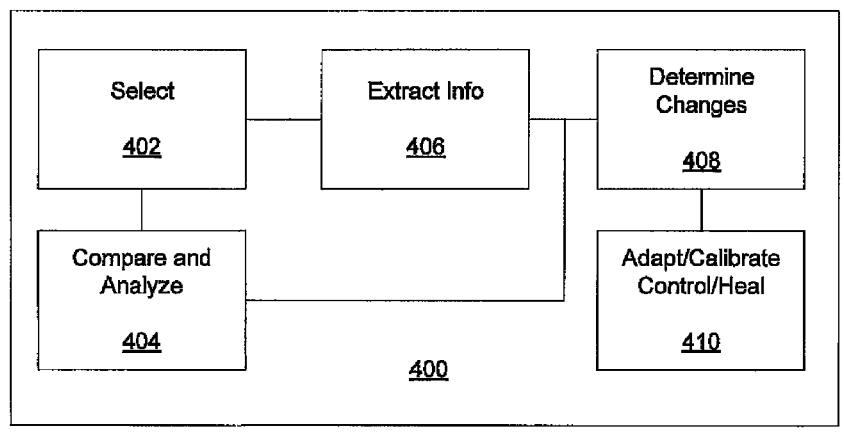
FIG. 4 is a block diagram of an example embodiment of a method for adaptive control of a mixed-signal integrated circuit.

FIG. 4 illustrates an example method 400 of adaptive control of an integrated circuit. A circuit may include a primary function circuit, a digitally controlled sub-system and a signal analyzer. The primary function circuit may perform a primary function of the circuit, for example a power amplifier. The digitally controlled sub-system may operate in conjunction with the primary function circuit to perform some control or sub-function to make the primary function circuit perform more ideally. The signal analyzer may operate in conjunction with the analog sub-system to adapt the operation of the analog sub-system to account for or compensate for non-ideal operating conditions of the analog sub-system.

The signal analyzer may select 402 selected frequencies for analysis. For example, RF MUX of a signal analyzer may select RF frequencies for analysis, and/or Baseband MUX of a signal analyzer may select baseband signals for analysis. In an example embodiment, the MUX may sequentially or alternately select various groups or pairs of signals for real-time analysis and adaptive control of the digitally controlled sub-system and the functional circuit.

In an example embodiment, the signal analyzer may compare and analyze 404 the selected frequencies. Comparing and analyzing 404 may determine dc offsets, power, bandwidth, and power spectrum and may provide information for automatic configuration, adjustment, calibration or self-healing of the digitally controlled analog sub-system.

Comparing and analyzing 404 may include real-time spectral analysis of the error signal. From the power spectrum of the error signal, the signal analyzer may provide a cost-function, e.g. out-of-band emission power, for adaptive adjustment of the pre-distortion circuit. From the in-band error spectrum, the signal analyzer may determine whether the power amplifier has non-idealities, for example memory effect, and the magnitude or strength of the non-ideality or memory effect.

For example, a signal analyzer may compare 404 an input or reference RF signal with an output or feedback RF signal. Responsive to the comparison and analysis, the signal analyzer may extract various information 406 such as, for example, gain, group delay, and waveform distortion that involve measuring pairs of signals.

Responsive to the comparison and analysis 404 and extraction of information 406, the signal analyzer may determine changes to various operating parameters 408. The analysis, evaluation and determination of changes may be made by the DSP 106 (FIG. 1), for example by a DSP ASIC and/or a microcontroller 214 (FIG. 2) working together. Based on those determinations, the signal analyzer may generate adaptive control signals to adapt, calibrate, control or heal 410 the operation of the analog sub-circuit. Adapting 410 the operation may account for or compensate for various inaccuracies, inefficiencies, and/or non-idealities of the functioning of the primary functional circuit or the digitally controlled analog sub-system as desired or appropriate depending on the particular application. In an example embodiment, where the sub-system is a pre-distortion circuit for a power amplifier, the signal analyzer's adaptation control signals may cause the pre-distortion circuit to use a variable number of polynomial blocks (as discussed above with respect to FIG. 3), as appropriate, based on the analysis of the selected signals.

Although embodiments of the invention has been shown and depicted, various other changes, additions and omissions in the form and detail thereof may be made therein without departing from the intent and scope of this invention. For example, embodiments of a signal analyzer may be used with a pre-distortion circuit for a power amplifier as discussed herein, or may be used generally with other multi-frequency integrated circuits (IC) with digitally controlled analog sub-systems. The appended claims encompass all such changes and modifications as fall within the true spirit and scope of this invention.

What is claimed is:

1. A mixed-signal adaptive integrated circuit, comprising:
an analog circuit receiving and processing a first analog input signal to provide an analog output signal under control of one or more control signals;
a control circuit receiving one or more digital input signals to provide the control signals; and
a signal analyzer receiving a second analog input signal and, based on the first and second analog input signals, provide the digital input signals.

2. The mixed-signal adaptive integrated circuit of claim 1, wherein the second analog input signal is an output signal of a power amplifier receiving the analog output signal.

3. The mixed-signal adaptive integrated circuit of claim 2, wherein the analog circuit provides pre-distortion to the first analog input signal based so as to linearize a transfer function of the power amplifier.

4. The mixed-signal adaptive integrated circuit of claim 3, wherein the analog output signal has a waveform generated according to a polynomial $$\sum_{k=1}^{N} c_k r^k (t - \tau_m),$$

where $r(t-\tau_m)$ is a delayed copy of the first analog input signal.

5. The mixed-signal adaptive integrated circuit of claim 4, wherein the control signals select a variable number of polynomial blocks in the analog circuit, and wherein the control signals are generated in the control circuit according to digital input signals from the signal analyzer.

6. The mixed-signal adaptive integrated circuit of claim 1, comprising a baseband multiplexor selecting the first analog signal from a plurality of baseband RF signals.

7. The mixed-signal adaptive integrated circuit of claim 1, comprising an RF multiplexor for selecting the second analog input signal from a plurality of RF signals for analysis in the signal analyzer.

8. The mixed-signal adaptive integrated circuit of claim 1, wherein the signal analyzer measures at least one of a peak-to-average ratio, a cumulative complementary distribution function (CCDF), a power spectrum, or an out-of-band spectral leakage of the second analog signal.

9. The mixed-signal adaptive integrated circuit of claim 1, wherein the signal analyzer analyzes and compares the difference between the first analog input signal and the second analog input signal.

10. The mixed-signal adaptive integrated circuit of claim 1, wherein the signal analyzer extracts at least one of a power gain, a group delay, or a property of an error signal.

11. The mixed-signal adaptive integrated circuit of claim 1, wherein the property of the error signal is one of a mean-square error, in-band distortion, or error spectrum.

12. The mixed-signal adaptive integrated circuit of claim 1, wherein the analog output signal of the mixed-signal adaptive integrated circuit is provided to a power amplifier as a pre-distorted input signal to provide an amplified output signal.

13. The mixed-signal adaptive integrated circuit of claim 4, wherein the analog output signal of the mixed-signal adaptive integrated circuit is provided to a power amplifier as a pre-distorted input signal to provide an amplified output signal.

14. The mixed-signal adaptive integrated circuit of claim 5, wherein the analog output signal of the mixed-signal adaptive integrated circuit is provided to a power amplifier as a pre-distorted input signal to provide an amplified output signal.

* * * * *